(12) United States Patent
Heid

(10) Patent No.: US 7,791,340 B2
(45) Date of Patent: Sep. 7, 2010

(54) MAGNETIC RESONANCE IMAGING APPARATUS AND METHOD THAT PRODUCE A VIRTUAL TOTAL CYLINDRICAL MAXIMUM REAL MEASUREMENT VOLUME

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 28 days.

(21) Appl. No.: 12/138,626

(22) Filed: Jun. 13, 2008

(65) Prior Publication Data

US 2008/0315881 A1 Dec. 25, 2008

(30) Foreign Application Priority Data

Jun. 13, 2007 (DE) .................. 10 2007 027 170

(51) Int. Cl.
*G01V 3/00* (2006.01)
(52) U.S. Cl. .................. 324/307; 324/309; 324/318
(58) Field of Classification Search ......... 324/300–322; 600/410, 411, 422; 606/1; 418/271
See application file for complete search history.

(56) References Cited

U.S. PATENT DOCUMENTS

| | | | |
|---|---|---|---|
| 5,928,148 A | 7/1999 | Wang et al. | |
| 6,385,478 B1 * | 5/2002 | Hajnal | 600/410 |
| 6,794,869 B2 * | 9/2004 | Brittain | 324/309 |
| 6,801,034 B2 * | 10/2004 | Brittain et al. | 324/309 |
| 6,891,374 B2 * | 5/2005 | Brittain | 324/309 |
| 6,897,655 B2 * | 5/2005 | Brittain et al. | 324/309 |
| 7,312,610 B2 | 12/2007 | Harder | |
| 7,527,486 B2 * | 5/2009 | Del Rio | 418/270 |
| 7,621,730 B2 * | 11/2009 | Del Rio et al. | 418/270 |
| 2002/0140423 A1 * | 10/2002 | Brittain | 324/301 |
| 2002/0143247 A1 * | 10/2002 | Brittain et al. | 600/410 |
| 2002/0173715 A1 * | 11/2002 | Kruger et al. | 600/410 |
| 2003/0011369 A1 * | 1/2003 | Brittain et al. | 324/309 |
| 2004/0155654 A1 * | 8/2004 | Brittain | 324/309 |
| 2005/0245913 A1 * | 11/2005 | Del Rio | 606/1 |
| 2005/0256512 A1 * | 11/2005 | Del Rio et al. | 606/1 |
| 2006/0241379 A1 * | 10/2006 | Greiser et al. | 600/410 |
| 2008/0315881 A1 * | 12/2008 | Heid | 324/318 |

OTHER PUBLICATIONS

"Magnet Optimization for Prepolarized Magnetic Resonance Imaging," Hau Xu, Published Dissertation, Stanford University, Oct. 2002.
"An Improved Three-Coil System for Producing a Uniform Magnetic Field," Barker et al, J. Sci. Instrum., vol. 27 (1950), pp. 197-199.

* cited by examiner

*Primary Examiner*—Brij B. Shrivastav
*Assistant Examiner*—Tiffany A Fetzner
(74) *Attorney, Agent, or Firm*—Schiff Hardin LLP

(57) ABSTRACT

A magnetic resonance apparatus has a basic field magnet that generates a basic magnetic field with a homogeneity region of the basic magnetic field in which the basic magnetic field is homogeneous and with a maximum real measurement volume contained in the homogeneity region. The apparatus has a movable patient bed and a control unit that controls the movable patient bed. The maximum measurement volume thereby exhibits a cylindrical shape. A virtual total measurement volume that is greater than the maximum real cylindrical measurement volume can be generated by the control unit together with the movable patient bed.

8 Claims, 2 Drawing Sheets

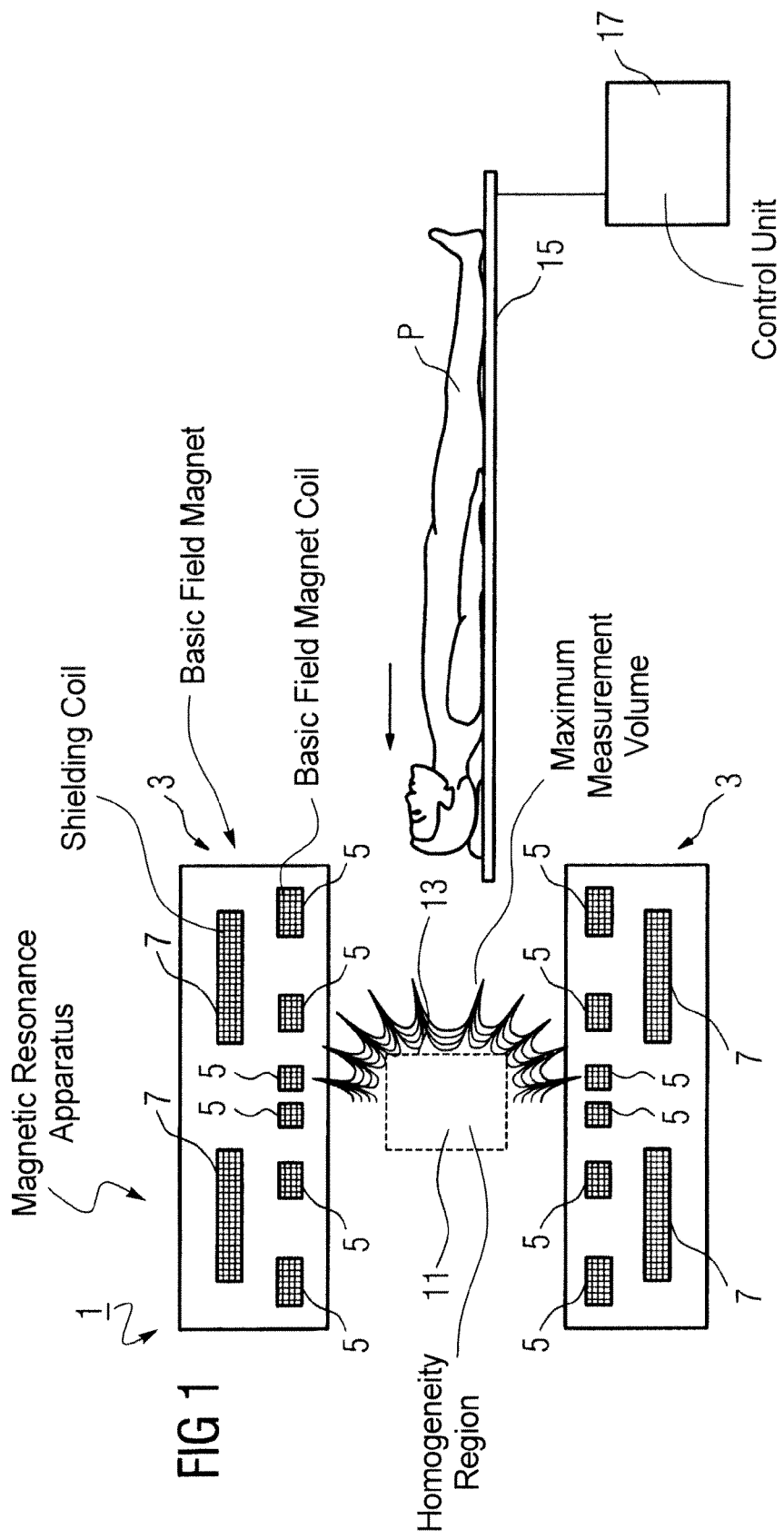

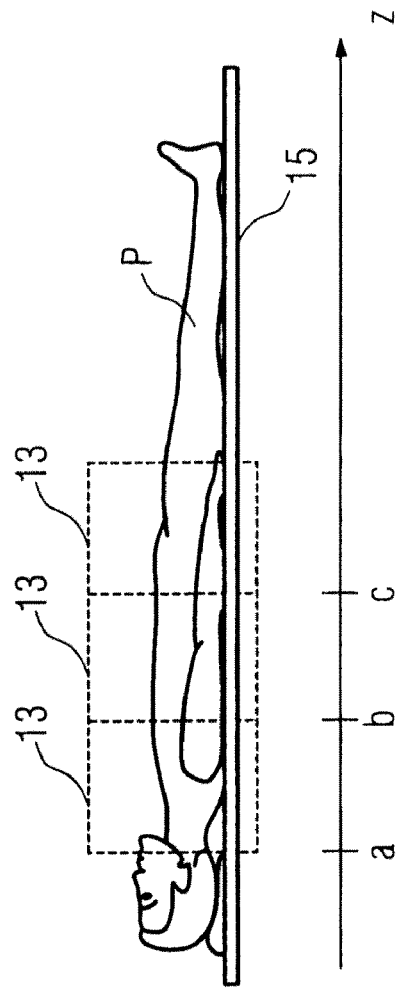
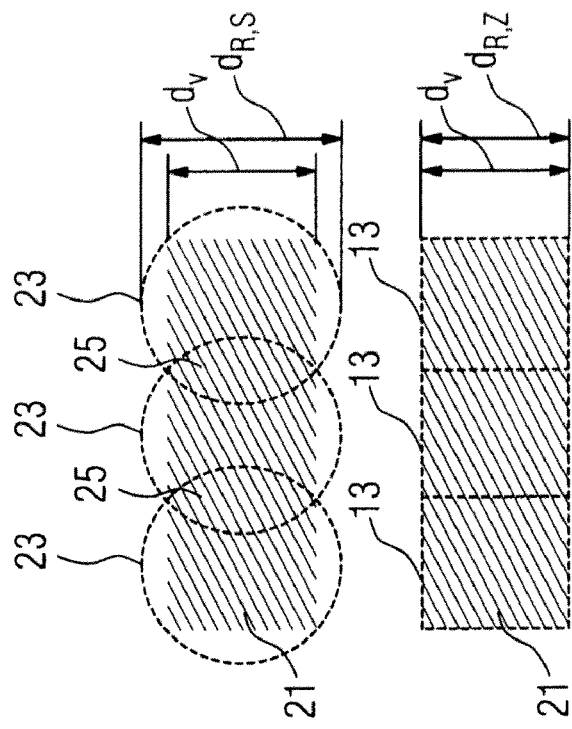
FIG 4
FIG 3
FIG 2

MAGNETIC RESONANCE IMAGING APPARATUS AND METHOD THAT PRODUCE A VIRTUAL TOTAL CYLINDRICAL MAXIMUM REAL MEASUREMENT VOLUME

BACKGROUND OF THE INVENTION

1. Field of the Invention

The present invention concerns a magnetic resonance apparatus and a method for conducting a magnetic resonance examination.

2. Description of the Prior Art

For the successful implementation of an imaging magnetic resonance examination (in the following "MR" stands for "magnetic resonance"), the basic magnetic field in an imaging or examination region (measurement volume) must be sufficiently strong and homogeneous in order to be able to take optimally exact measurements. A homogeneity with a maximum deviation of less than 3 ppm (in particular less than 1 ppm) (ppm: "parts per million") is required in the measurement volume.

Basic magnetic fields of approximately 0.5 T and greater are generated with the use of a superconducting basic field magnet that conventionally is formed of multiple superconducting coils. In order to be able to achieve the required field strength and homogeneity in a predetermined measurement volume, a large effort must be made in the development of the basic field magnet.

The coils are typically arranged such that the homogeneous region that predetermines the maximum measurement volume has a spherical shape. The spherical shape results from the employed approach to bring to zero the coefficients of lower orders of a spherical function expansion of the magnetic field generated by the coils. The first coefficient not brought to zero typically describes the significant component of the remaining inhomogeneity. The goal of such a method is thus to bring as many coefficients of lower order to zero as possible.

Such methods for generation of a homogeneous magnetic field in a spherical region with superconducting coils go back to the start of MR technology. For example, J. R. Baker, "An improved three-coil system for producing a uniform magnetic field", J. Sci. Instrum., vol. 27, pp. 197, 1950.

Today an optimally large, maximally adjustable measurement volume (and thus an optimally large homogeneity volume) is increasingly demanded, for example in order to enable MR angiographies of the peripheral vessels or MR tomography examinations of optimally large portions of the spinal column in the measurement volume.

The generation of an optimally large homogeneity region places high demands on the coil design. An increased number of superconducting coils for the basic field magnets and high technical effort are necessary in order to achieve such large regions with homogeneous basic magnetic field and sufficient basic magnetic field strength. The coil count has direct effects on the size and the cost of an MR apparatus and the available maximum measurement volume. The latter is often still smaller than an examination region of a patient to be examined.

In order to examine such a large examination subject, it is known (for example) from U.S. Pat. No. 5,928,148 to examine the examination subject step-by-step.

In chapter 3 in his dissertation "Magnet Optimization for Prepolarized Magnetic resonance Imaging", Stanford University, October 2002, Hao Xu describes a method for the development of a magnet with an arbitrary predeterminable homogeneity volume with a low number of magnet coils and optimally small size and power. The magnetic field $b_m$ (m=1, 2, ..., M) is predetermined at M target points on the edge of the homogeneity volume and the currents $i_n$ (n=1, 2, ..., N) required for the generation of this field are calculated in N possible magnet coils. $b_m = A_{mn} i_n$ thereby applies. The matrix elements $A_{mn}$ depend on the radius of the n-th coil $r_n$, the location of the n-th coil $z_n$, the radius of the m-th coil $\rho_m$, and the location of the m-th target point $\zeta_m$. $\|b_m - B_0\| \leq \epsilon B_0$ is predetermined as a boundary homogeneity condition for $b_m$, wherein $B_0$ is the desired magnetic field strength and $\epsilon$ indicates the allowed deviation in ppm.

There are examples of special magnet forms for special applications. Among other things, a head and neck magnet for an examination of tobacco-caused cancer that has a cylindrical homogeneity volume in which the head and neck of a patient are precisely placed is described in chapter 3.3.3.

SUMMARY OF THE INVENTION

An object of the present invention is to provide an MR apparatus and a method that enable an examination of an examination region to be examined with optimal utilization of a homogeneity region of the MR apparatus.

The magnetic resonance apparatus according to the invention has a basic field magnet that generates a basic magnetic field; a homogeneity region of the basic magnetic field in which the basic magnetic field is homogeneous, a maximum real measurement volume that is inscribed in the homogeneity region; a movable patient bed; and a control unit to control the movable patient bed. The maximum measurement volume exhibits a cylindrical shape. A virtual total measurement volume that is greater than the maximum real cylindrical measurement volume can be generated by means of the control unit together with the movable patient bed.

An MR apparatus according to the invention can be kept smaller and more cost-effective compared to a conventional MR apparatus in order to attain a virtual total measurement volume of a specific size.

By positioning an examination subject at at least subject positions, a cylindrical real measurement volume of a magnetic resonance apparatus according to the invention acts as a virtual total measurement volume whose size is greater than the size of the real measurement volume in the method for implementation of a magnetic resonance examination. The real measurement volume is thus optimally utilized in the method.

Examinations with a maximum virtual total measurement volume with minimal size and production costs of the MR apparatus are enabled with the MR apparatus according to the invention and the method according to the invention. Moreover, an examination of an examination subject can be conducted with a minimal number of individual examinations since an overlapping and a radius loss of real measurement volumes is minimized.

BRIEF DESCRIPTION OF THE DRAWINGS

FIG. 1 is a schematic illustration of an embodiment of an MR apparatus according to the invention.

FIG. 2 schematically illustrates an embodiment of the method according to the invention.

FIGS. 3 and 4 show a comparison of an MR apparatus according to the invention with a conventional MR apparatus.

DESCRIPTION OF THE PREFERRED EMBODIMENT

FIG. 1 schematically shows an MR apparatus according to the invention in a side view. Only the parts important to the invention are shown. Further parts such as, for example, local coils and units for display and controlling the MR apparatus are sufficiently known from the prior art and not shown for clarity.

The MR apparatus 1 has a superconducting basic field magnet 3. The basic field magnet 3 in the shown form comprises six magnet coils 5 and two shielding coils 7 that are fed with current in the opposite direction as the magnet coils 5. The concentrically arranged magnet coils 5 generate a basic magnetic field. The basic magnetic field is homogeneous in a region (the homogeneity region 11). The lines running around the homogeneity region 11 mark schematic regions of positive and negative deviation from the desired magnetic field strength. They represent the inhomogeneity profile.

A maximum measurement volume 13 is inscribed (dashed lines) in the homogeneity region 11. A fluctuation of the predominant basic magnetic field is smaller than 3 ppm (in particular smaller than 1 ppm) in the maximum measurement volume 13. The homogeneity region 11 is thereby designed such that the maximum measurement volume 13 has the shape of a cylinder. A cylindrical homogeneity region is also discussed, although a homogeneity of the basic magnetic field is also present in the shown outgrowths of the inhomogeneity profile. However, since these outgrowths cannot be used for examinations, they are normally not considered.

An examination subject (for instance a patient P) is located on a patient bed 15 that can be moved along the axis of the MR apparatus that corresponds to the axis of the cylindrical real measurement volume (z-direction) in which the MR apparatus can be moved (arrow direction). The movement of the patient bed can be controlled by a control unit 17 connected with the patient bed 15 such that a virtual total measurement volume can be generated that is greater than the cylindrical real measurement volume. This is described more precisely in detail below.

For example, an MR apparatus 1 according to the invention has a length of approximately 150 cm in the z-direction. Given a homogeneity of ±1 ppm, the maximum measurement volume 13 has a diameter of approximately 40 cm and an axial length of approximately 30 cm, for example. The inner radius of the magnet coils 5 lies between 50 and 53 cm. This radius is sufficiently large in order to be able to accommodate additional components of the MR apparatus (such as local coils, for example) and the examination subject on the patient bed.

As indicated by the different size of the magnet coils 5, the magnet coils 5 have different widths and heights in terms of their cross-sectional area but are symmetrically arranged. The precise positions and dimensions are determined as described above according to the specifications of the practical required dimensions of the measurement volume and additional restrictions (for example with regard to the desired number of magnet coils).

FIG. 2 illustrates the inventive method with an MR apparatus according to the invention. A patient P on a patient bed 15 is moved into the MR apparatus such that a first section z(a) through z(b) of the examination area to be examined (for example the spinal column) is located in the maximum cylindrical real measurement volume 13 of the MR apparatus. An examination is started and measurement data are acquired from this first section.

The patient bed 15 is then moved further into the MR apparatus until a second section z(b) through z(c) of the examination subject to be examined that follow the first section is located in the maximum cylindrical real measurement volume 13. An examination is again started and measurement data are acquired from the second section of the examination subject to be examined.

This procedure is repeated until the examination subject to be examined has been completely examined. In the shown case a third examination is required at a third position z(c) in order to cover the entire spinal column of the patient P.

By stringing together individual examinations at various positions of the patient bed 15, a virtual total measurement volume is generated that is greater than the cylindrical real measurement volume 13. In the shown case the virtual total measurement volume is three times as large as the cylindrical real measurement volume 13.

FIGS. 3 and 4 compare an MR apparatus according to the invention with a conventional MR apparatus given examinations at multiple positions of a patient bed.

The situation from FIG. 2 is shown again in FIG. 3. By stringing together three cylindrical real measurement volumes 13, a virtual cylindrical total measurement volume 21 (hatched area) is generated. The virtual total measurement volume 21 is thereby three times as large as the cylindrical real measurement volume 13. The diameter of the virtual total measurement volume $d_v$ is precisely as large as the diameter of the cylindrical real measurement volume $d_{R,z}$.

In order to generate a virtual total measurement volume 21 of the same size as in FIG. 3 with a conventional MR apparatus with spherical real measurement volume 23, the spherical real measurement volumes 23 must overlap in regions 25 as shown in FIG. 4. Moreover, the diameter of the real spherical measurement volume $d_{R,s}$ must be greater than the diameter of the virtual total measurement volume $d_v$.

A large virtual total measurement volume 21 is easier to generate with an inventive MR apparatus with cylindrical real measurement volume 13 than with a conventional MR apparatus with spherical real measurement volume 23. With identical effect, both the costs and the size of the MR apparatus with a cylindrical real measurement volume 13 are reduced compared to the MR apparatus with a spherical real measurement volume 23.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
    a magnetic resonance data acquisition unit having a basic field magnet that generates a basic magnetic field having a homogeneity region containing a smaller, homogenous, cylindrical, maximum real measurement volume;
    a patient bed that is movable through said cylindrical maximum real measurement volume; said patient bed being configured to support a patient thereon; and
    a control unit configured to control movement of said patient bed through said cylindrical maximum real measurement volume acquisition of magnetic resonance data by said magnetic resonance data acquisition unit in order to produce a virtual total cylindrical measurement volume composed of multiple volumes each equal to said cylindrical maximum real measurement volume, by coordinating movement of said patient bed with acquisition of magnetic resonance data in order to acquire said magnetic resonance data from different, adjacent regions of a patient on the patient bed the different, adjacent regions having an extent within a plurality of multiples of said cylindrical maximum real measurement volume.

2. A magnetic resonance apparatus as claimed in claim 1 wherein said basic field magnet comprises a plurality of concentric magnet coils arranged around a longitudinal axis of said cylindrical maximum real measurement volume.

3. A magnetic resonance apparatus as claimed in claim 1, wherein said basic field magnet comprises shielding coils configured for active shielding of magnetic fields outside of said basic field magnet.

4. A magnetic resonance apparatus as claimed in claim 1 wherein said patient bed is movable in a longitudinal direction through said cylindrical real measurement volume.

5. A magnetic resonance apparatus as claimed in claim 1 wherein said control unit is configured to move said patient bed successively to a plurality of positions in said basic field magnet, and is configured to produce said virtual total measurement volume from at least two successive individual magnetic resonance data acquisitions respectively occurring at two of said successive positions.

6. A method for implementing a magnetic resonance examination with a magnetic resonance apparatus comprising a basic field magnet that generates a basic magnetic field having a homogeneity region containing a smaller, homogenous, cylindrical maximum real measurement volume, and a movable patient bed that is movable through said cylindrical maximum real measurement volume, said method comprising the steps of:

successively moving a subject on the patient bed through at least two successive positions in said cylindrical real measurement volume; and obtaining respective magnetic resonance data acquisitions at said successive positions to produce a virtual total cylindrical measurement volume that is composed of multiple volumes each equal to said cylindrical maximum real measurement volume, by coordinating movement of said patient bed with acquisition of magnetic resonance data to acquire said magnetic resonance data from different adjacent regions of a patient on the patient bed the different, adjacent regions having an extent within a plurality of multiples of said cylindrical maximum real measurement volume.

7. A method as claimed in claim 6 comprising moving successive sections of said patient through said cylindrical real measurement volume, and obtaining said respective magnetic resonance data acquisitions from said successive sections of said patient.

8. A method as claimed in claim 6 comprising moving said patient bed and said patient through a longitudinal axial direction of said cylindrical real measurement volume.

* * * * *